United States Patent
Lee et al.

(10) Patent No.: US 9,508,834 B1
(45) Date of Patent: Nov. 29, 2016

(54) SEMICONDUCTOR DEVICE AND METHOD FOR FABRICATING THE SAME

(71) Applicant: UNITED MICROELECTRONICS CORP., Hsin-Chu (TW)

(72) Inventors: Hao-Ming Lee, Taichung (TW); Sheng-Hao Lin, Hsinchu County (TW); Huai-Tzu Chiang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/873,173

(22) Filed: Oct. 1, 2015

(30) Foreign Application Priority Data

Aug. 28, 2015 (CN) .......................... 2015 1 0537573

(51) Int. Cl.
| | |
|---|---|
| H01L 21/00 | (2006.01) |
| H01L 29/66 | (2006.01) |
| H01L 29/78 | (2006.01) |
| H01L 29/06 | (2006.01) |
| H01L 29/161 | (2006.01) |
| H01L 29/165 | (2006.01) |
| H01L 21/02 | (2006.01) |

(52) U.S. Cl.
CPC ..... *H01L 29/66818* (2013.01); *H01L 29/0653* (2013.01); *H01L 29/161* (2013.01); *H01L 29/165* (2013.01); *H01L 29/7851* (2013.01); *H01L 21/02* (2013.01)

(58) Field of Classification Search
CPC .................................. H01L 29/66818
See application file for complete search history.

(56) References Cited

U.S. PATENT DOCUMENTS

| 8,269,209 B2 | 9/2012 | Shah et al. | |
|---|---|---|---|
| 8,497,177 B1 | 7/2013 | Chang et al. | |
| 2009/0085027 A1* | 4/2009 | Jin et al. ............... | B82Y 10/00 257/24 |

* cited by examiner

*Primary Examiner* — William Harriston
(74) *Attorney, Agent, or Firm* — Winston Hsu; Scott Margo

(57) ABSTRACT

A method for fabricating semiconductor device is disclosed. The method includes the steps of: providing a substrate having a fin-shaped structure thereon and a shallow trench isolation (STI) around the fin-shaped structure, wherein the fin-shaped structure comprises a top portion and a bottom portion; removing part of the STI to expose the top portion of the fin-shaped structure; and performing an oxidation process on the exposed top portion of the fin-shaped structure to divide the top portion into a first top portion and a second top portion while forming an oxide layer around the first top portion.

17 Claims, 3 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of oxidizing the tip of a fin-shaped structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

Nevertheless, conventional FinFET fabrication of forming recesses after removing part of fin-shaped structures to accommodate the growth of epitaxial layer typically causes the fin-shaped structures to be lower than the surrounding shallow trench isolation (STI) as a result of over-etching, thereby influencing the formation of epitaxial layer afterwards. Hence, how to improve the current FinFET fabrication process for resolving this issue has become an important task in this field.

SUMMARY OF THE INVENTION

According to a preferred embodiment of the present invention, a method for fabricating semiconductor device is disclosed. The method includes the steps of: providing a substrate having a fin-shaped structure thereon and a shallow trench isolation (STI) around the fin-shaped structure, wherein the fin-shaped structure comprises a top portion and a bottom portion; removing part of the STI to expose the top portion of the fin-shaped structure; and performing an oxidation process on the exposed top portion of the fin-shaped structure to divide the top portion into a first top portion and a second top portion while forming an oxide layer around the first top portion.

According to another aspect of the present invention, a semiconductor device is disclosed. The semiconductor device includes: a substrate having a fin-shaped structure thereon, in which the fin-shaped structure comprises a first top portion, a second top portion, and a bottom portion, and the first top portion and the second top portion comprise a step therebetween; and a shallow trench isolation (STI) around the fin-shaped structure These and other objectives of the present invention will no doubt become obvious to those of ordinary skill in the art after reading the following detailed description of the preferred embodiment that is illustrated in the various figures and drawings.

DETAILED DESCRIPTION

Figure 1:
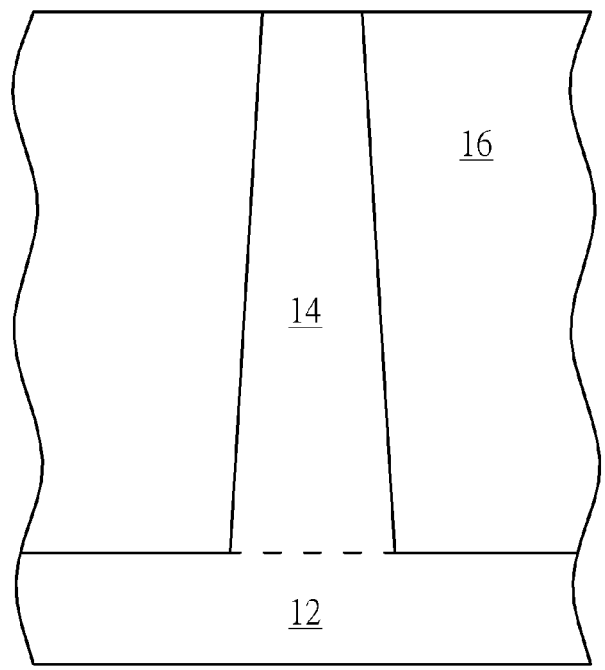
FIGS. 1-5 illustrate a method for fabricating semiconductor device according to a preferred embodiment of the present invention.

Referring to FIGS. 1-5, FIGS. 1-5 illustrate a method for fabricating semiconductor device according to a preferred embodiment of the present invention. As shown in FIG. 1, a substrate 12, such as a silicon substrate or silicon-on-insulator (SOI) substrate is first provided, and at least one fin-shaped structure 14 is formed on the substrate 12, in which the fin-shaped structure 14 and the substrate 12 at this moment are fabricated by same material, such as both being composed of single crystal silicon or monocrystalline silicon. It should be noted that even though only one fin-shaped structure 14 is prepared in this embodiment, the quantity of the fin-shaped structure 14 is not limited to one. For instance, it would also be desirable to prepare one or more fin-shaped structure 14 on the substrate 12 according to the demand of the product.

In this embodiment, the fin-shaped structure 14 is preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the underneath substrate, and through additional fin cut processes, desirable pattern structures, such as stripe patterned fin-shaped structures could be obtained.

Alternatively, the formation of the fin-shaped structure 14 could also be accomplished by first forming a patterned mask (not shown) on the substrate, 12, and through an etching process, the pattern of the patterned mask is transferred to the substrate 12 to form the fin-shaped structure 14, which is also within the scope of the present invention. Next, a shallow trench isolation (STI) 16 is formed to surround the fin-shaped structure 14, in which the top surface of the STI 16 is even with the top surface of the fin-shaped structure 14. Preferably, the STI 16 is composed of insulating material such as silicon oxide, but not limited thereto.

Figure 2:
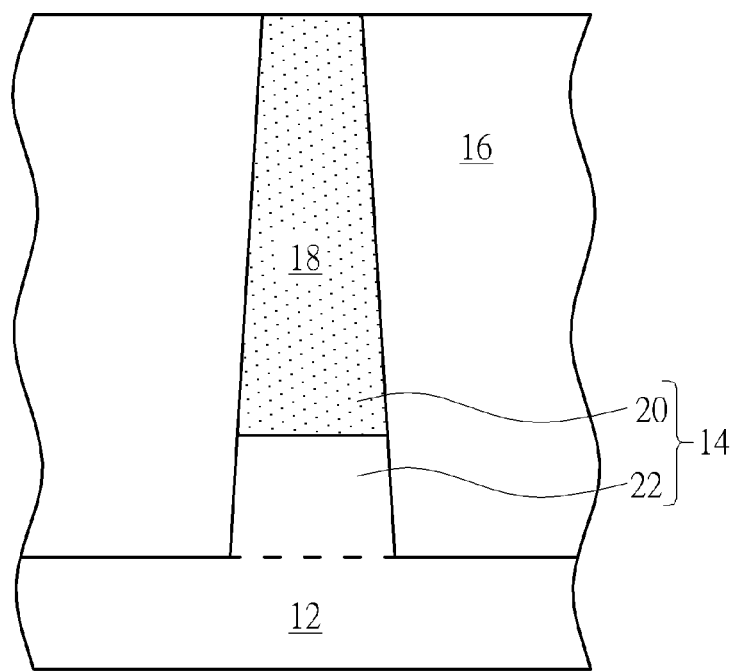

Next, an etching process is conducted by using the STI 16 as mask to remove part of the fin-shaped structure 14 for forming a recess (not shown) in the STI 16. Next, as shown in FIG. 2, an epitaxial growth process is conducted to grow an epitaxial layer 18 on the remaining fin-shaped structure 14 surface. In this embodiment, the epitaxial layer 18 preferably includes silicon germanium, in which the germanium concentration of the epitaxial layer 18 is 30% to 50%. It should be noted that even though silicon germanium is used as the designated epitaxial material in this embodiment, it would also be desirable to select epitaxial material with other dopants for replacing the epitaxial layer 18, which is also within the scope of the present invention. After the formation of the epitaxial layer 18, a top portion 20 and a bottom portion 22 of the fin-shaped structure 14 are defined, in which the top portion 20 and the bottom portion 22 are preferably composed of different material. For instance, the top portion 20 is composed of epitaxial material consisting of silicon germanium while the bottom portion 22 is composed of monocrystalline silicon.

Figure 3:
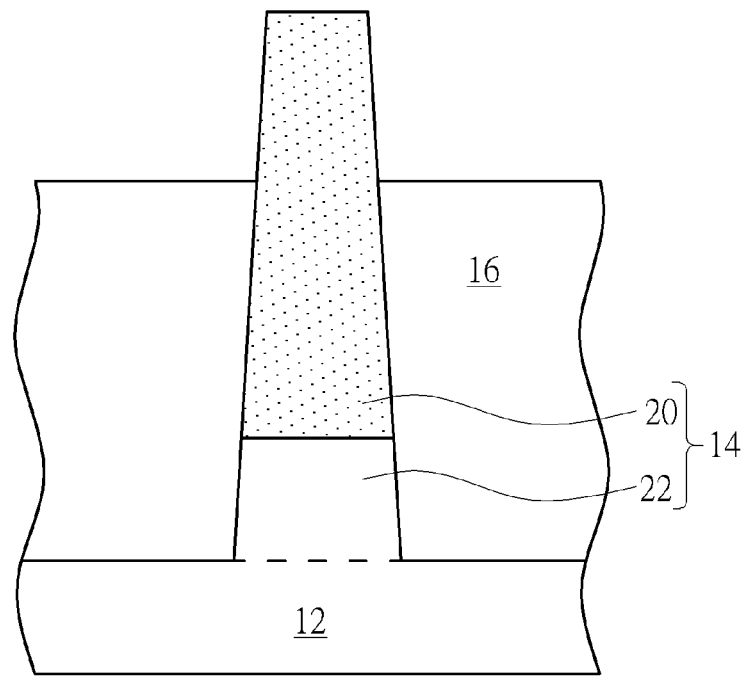

Next, as shown in FIG. 3, an etching process is conducted to remove part of the STI 16 and expose part of the top portion 20 of the fin-shaped structure 14 so that the top surface of the remaining STI 16 is still higher than the top surface of the bottom portion 22 of the fin-shaped structure 14.

Figure 4:
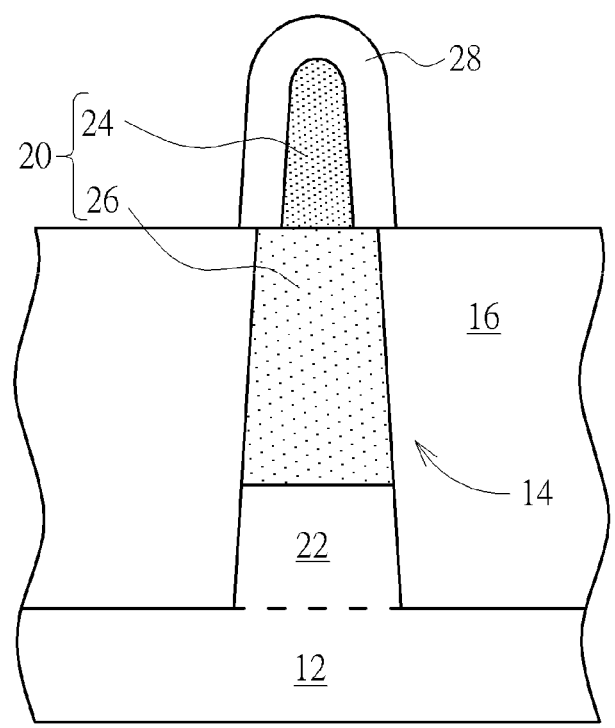

Next, as shown in FIG. 4, an oxidation process is conducted on the exposed top portion 20 of fin-shaped structure 14 to divide the top portion 20 into a first top portion 24 and a second top portion 26, and form an oxide layer 28 around the first top portion 24 at the same time. In this embodiment, the oxidation process is preferably a low temperature oxidation process, in which an oxidation temperature preferably between 700° C. and 900° C., or most preferably at 800° C. is utilized to condense or concentrate the germanium atoms to the exposed tip of the top portion 20. This shrinks the tip of the fin-shaped structure 14 and divides the top portion 20 into two portions, such as the first top portion 24 and second top portion 26 addressed earlier. Preferably, the germanium concentration of the first top portion 24 is 70% to 100% while the germanium concentration of the second top portion 26 is 30% to 50%. It should be noted that since the oxide layer 28 is formed during the oxidation process while the STI 16 is formed by chemical vapor deposition (CVD), the density of the oxide layer 28 is essentially different from the STI 16. Nevertheless, as both the oxide layer 28 and STI 16 are composed of silicon oxide, it would be plausible to treat the oxide layer 28 contacting the STI 16 and the STI 16 itself as one after the oxide layer 28 is formed on the top portion 24 of the fin-shaped structure 14.

Figure 5:
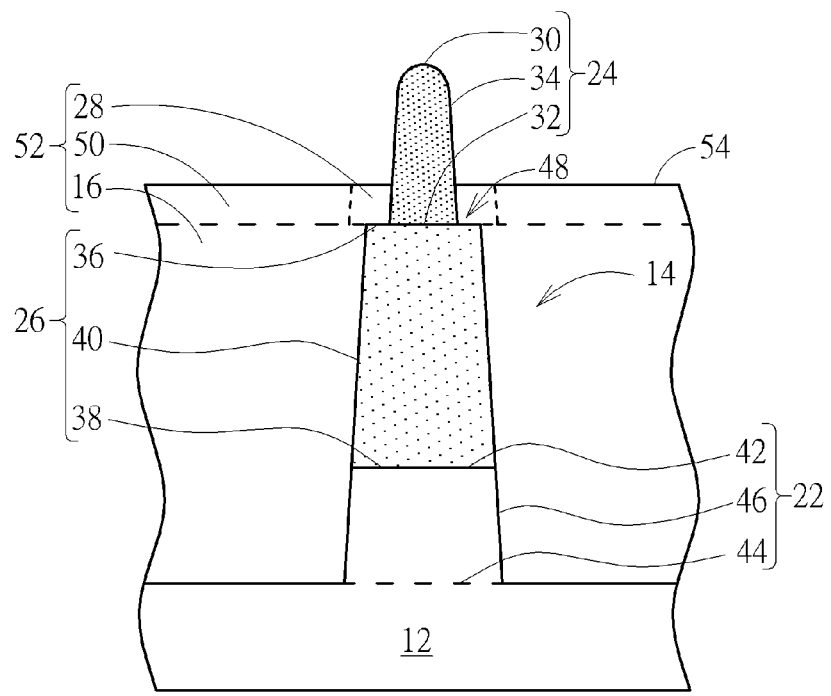

Next, as shown in FIG. 5, a CVD process could be selectively conducted to deposit another oxide layer 50, and another etching process is conducted to remove part of the new oxide layer 50 and part of the oxide layer 28 for exposing the first top portion 24 of the fin-shaped structure 14 without exposing the second top portion 26. This creates a new STI 52 constituting the newly deposited oxide layer 50, the remaining oxide layer 28, and the original STI 16 and the top surface of the new STI 52 is preferably higher than the bottom surface of the first top portion 24 or the top surface of the second top portion 26. Next, transistor fabrication processes could be conducted by forming a gate structure (not shown) on the STI 16 and the first top portion 24 as well as a source/drain region (not shown) in the first top portion 24 adjacent to two sides of the gate structure. Since the fabrication of the gate structure and source/drain region is well known to those skilled in the art, the details of which are not explained herein for the sake of brevity. This completes the fabrication of a semiconductor device according to a preferred embodiment of the present invention.

Referring again to FIG. 5, which further illustrates a structural view of a semiconductor device according to a preferred embodiment of the present invention. As shown in FIG. 5, the semiconductor device includes a fin-shaped structure 14 disposed on the substrate 12 and a STI 52 around the fin-shaped structure 14. The fin-shaped structure 14 includes a first top portion 24, a second top portion 26, and a bottom portion 22, in which the first top portion 24 and second top portion 26 include a step 48 or step-shaped profile therebetween and the step 48 is embedded within the STI 52.

Specifically, the first top portion 24 of the fin-shaped structure 14 includes a substantially circular tip 30, a bottom surface 32, and two inclined sidewalls 34, the second top portion 26 includes a top surface 36, a bottom surface 38, and two inclined sidewalls 40, and the bottom portion 22 includes a top surface 42, a bottom surface 44, and two inclined sidewalls 46. Preferably, the aforementioned step 48 is constituted by the inclined sidewall 34 of the first top portion 24 and the top surface 36 of the second top portion 26, and the bottom surface 32 of the first top portion 24 is less than the top surface 36 of the second top portion 26, or the width of the bottom surface 32 of first top portion 24 is less than the width of the top surface 36 of second top portion 26. It should be noted that even though the first top portion 24, second top portion 26, and bottom portion 22 all include inclined sidewalls, it would also be desirable to adjust the sidewall profile of the fin-shaped structure 14 during the formation of the fin-shaped structure 14 so that each of the first top portion 24, second top portion 26, and bottom portion 22 would have vertical sidewalls, which is also within the scope of the present invention.

In this embodiment, the STI 52 is constituted by oxide layer 50, oxide layer 28, and STI 16. It should be noted that even though the oxide layer 50, oxide layer 28, and STI 16 are all composed of silicon dioxide, the density of the oxide layer 28 is essentially different from the densities of the STI 16 and oxide layer 50 since the oxide layer 28 is formed by oxidation process while the STI 16 and oxide layer 50 are fabricated by CVD processes.

Overall, the STI 52 is disposed adjacent to the fin-shaped structure 14 and surround the bottom portion 22, second top portion 26, and part of the first top portion 24, and the top surface 54 of the STI 52 is higher than the bottom surface 32 of the first top portion 24, or that part of first top portion 24 is protruding from the STI 52. Preferably, the bottom width of the first top portion 24 is approximately 10 nm and the height of the first top portion 24 protruding from the STI 52 is about 15 nm to 20 nm.

Viewing from material composition and dopant concentration perspective, the first top portion 24 and second top portion 26 are composed of epitaxial material consisting of silicon germanium while the bottom portion 22 is composed of monocrystalline silicon, in which the germanium concentration of the first top portion 24 is greater than the germanium concentration of the second top portion 26. In this embodiment, the germanium concentration of the first top portion 24 is 70% to 100% while the germanium concentration of the second top portion 26 is 30% to 50%, but not limited thereto.

Figure 6:
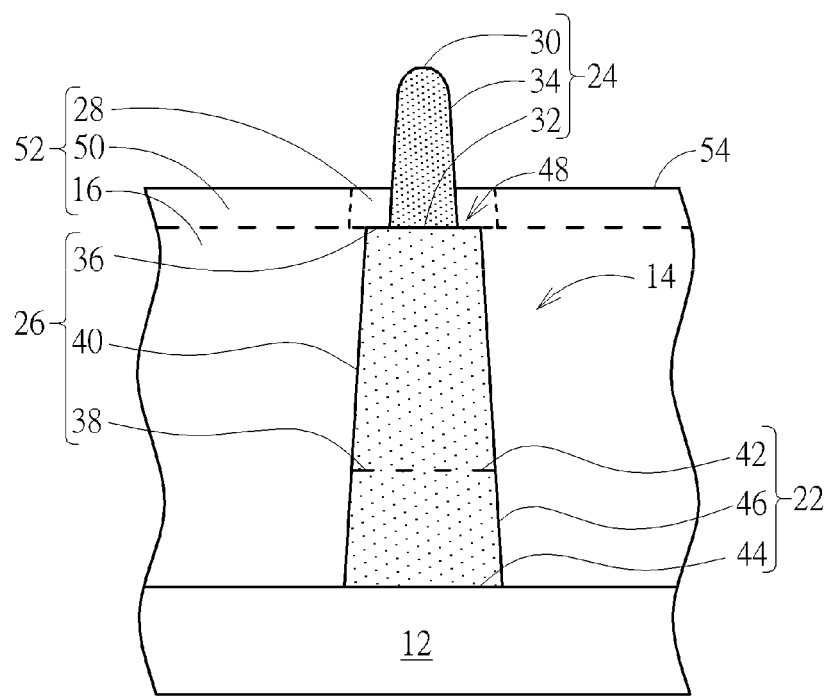
FIG. 6 illustrates a structural view of a semiconductor device according to another embodiment of the present invention.

Referring to FIG. 6, FIG. 6 illustrates a structural view of a semiconductor device according to another embodiment of the present invention. As shown in FIG. 6, the semiconductor device includes a fin-shaped structure 14 disposed on the substrate 12 and a STI 52 around the fin-shaped structure 14. The fin-shaped structure 14 includes a first top portion 24, a second top portion 26, and a bottom portion 22, in which the first top portion 24 and second top portion 26 include a step 48 or step-shaped profile therebetween and the step 48 is embedded within the STI 52. In contrast to the embodiment shown in FIG. 5, the first top portion 24, second top portion 26, and bottom portion 22 of this embodiment are all composed of epitaxial material consisting of silicon germanium. Hence, in contrast to the aforementioned embodiment of removing part of the fin-shaped structure 14 composed of monocrystalline and then growing epitaxial layer 18 on the bottom portion 22 of the remaining fin-shaped structure 14 as shown in FIGS. 1-2, this embodiment preferably removes all of the fin-shaped structure 14 composed of monocrystalline entirely, conducts epitaxial growth process to form another fin-shaped structure 14 composed of silicon germanium entirely, and then conducts processes from FIGS. 3-5 to form fin-shaped structure 14 having first top portion 24, second top portion 26, and bottom portion 22.

Similar to the embodiment shown in FIG. 5, the first top portion 24 of the fin-shaped structure 14 includes a substantially circular tip 30, a bottom surface 32, and two inclined sidewalls 34, the second top portion 26 includes a top surface 36, a bottom surface 38, and two inclined sidewalls 40, and the bottom portion 22 includes a top surface 42, a bottom surface 44, and two inclined sidewalls 46. Preferably, the aforementioned step 48 is constituted by the inclined sidewall 34 of the first top portion 24 and the top surface 36 of the second top portion 26, and the bottom surface 32 of the first top portion 24 is less than the top surface 36 of the second top portion 26, or the width of the bottom surface 32 of first top portion 24 is less than the width of the top surface 36 of second top portion 26.

In this embodiment, the STI 52 is constituted by oxide layer 50, oxide layer 28, and STI 16. It should be noted that even though the oxide layer 50, oxide layer 28, and STI 16 are all composed of silicon dioxide, the density of the oxide layer 28 is essentially different from the densities of the STI 16 and oxide layer 50 since the oxide layer 28 is formed by oxidation process while the STI 16 and oxide layer 50 are fabricated by CVD processes.

Overall, the STI 52 is disposed adjacent to the fin-shaped structure 14 and surround the bottom portion 22, second top portion 26, and part of the first top portion 24, and the top surface 54 of the STI 52 is higher than the bottom surface 32 of the first top portion 24, or that part of first top portion 24 is protruding from the STI 52. Preferably, the bottom width of the first top portion 24 is approximately 10 nm and the height of the first top portion 24 protruding from the STI 52 is about 15 nm to 20 nm.

Viewing from material composition and dopant concentration perspective, the first top portion 24, second top portion 26, and bottom portion 22 are all composed of epitaxial material consisting of silicon germanium, in which the germanium concentration of the first top portion 24 is greater than the germanium concentration of the second top portion 26 and the bottom portion 22, and the germanium concentration of the second top portion 26 is substantially equal to the germanium concentration of the bottom portion 22. In this embodiment, the germanium concentration of the first top portion 24 is 70% to 100% while the germanium concentration of the second top portion 26 and bottom portion 22 is 30% to 50%, but not limited thereto.

Overall, the present invention first forms a fin-shaped structure on a substrate and a STI surrounding the fin-shaped structure, in which the top portion of the fin-shaped structure being epitaxial material consisting of silicon germanium while the bottom portion of the fin-shaped structure being monocrystalline. Part of then STI is then removed and a low temperature oxidation process is conducted on the top portion of the fin-shaped structure to divide the top portion into a first top portion having higher germanium concentration and a second top portion having lower germanium concentration while forming an oxide layer around the first top portion. In contrast to the conventional approach of conducting two or more epitaxial growth processes to separate a fin-shaped structure into sections with different dopant concentration, the present invention only conducts one single epitaxial growth process accompanied by a low temperature oxidation process to form a fin-shaped structure having portions with different concentrations. This not only reduces the cost of conducting extra epitaxial growth process and chemical mechanical polishing (CMP) processes, but also improves the quality of the channel material used for fabricating transistor thereafter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first fin-shaped structure thereon;
   forming a shallow trench isolation (STI) around the first fin-shaped structure;
   removing part of the first fin-shaped structure;
   forming an epitaxial layer on the remaining first fin-shaped structure to form a second fin-shaped structure, wherein the second fin-shaped structure comprises a top portion and a bottom portion;
   removing part of the STI to expose the top portion of the second fin-shaped structure; and
   performing an oxidation process on the exposed top portion of the second fin-shaped structure to divide the top portion into a first top portion and a second top portion while forming an oxide layer around the first top portion.

2. The method of claim 1, wherein the top portion of the second fin-shaped structure comprises silicon germanium and the bottom portion of the second fin-shaped structure comprises silicon.

3. The method of claim 1, wherein the germanium concentration of the top portion is 30% to 50%.

4. The method of claim 1, wherein the germanium concentration of the second top portion is 30% to 50%.

5. The method of claim 1, wherein the germanium concentration of the first top portion is 70% to 100%.

6. The method of claim 1, further comprising removing the oxide layer after performing the oxidation process to expose the first top portion.

7. A semiconductor device, comprising:
   a substrate having a fin-shaped structure thereon, wherein the fin-shaped structure comprises a first top portion, a second top portion, and a bottom portion, and the first top portion and the second top portion comprise a step therebetween; and
   a shallow trench isolation (STI) around the fin-shaped structure, wherein a top surface of the STI is higher than a bottom surface of the first top portion.

8. The semiconductor device of claim 7, wherein the bottom surface of the first top portion is smaller than the top surface of the second top portion.

9. The semiconductor device of claim 7, wherein the first top portion, the second top portion, and the bottom portion comprise silicon germanium.

10. The semiconductor device of claim 9, wherein the germanium concentration of the first top portion is greater than the germanium concentration of the second top portion and the bottom portion.

11. The semiconductor device of claim 9, wherein the germanium concentration of the first top portion is 70% to 100%.

12. The semiconductor device of claim 9, wherein the germanium concentration of the second top portion and the bottom portion is 30% to 50%.

13. The semiconductor device of claim 7, wherein the first top portion and the second top portion comprise silicon germanium and the bottom portion comprises silicon.

14. The semiconductor device of claim 13, wherein the germanium concentration of the first top portion is greater than the germanium concentration of the second top portion.

15. The semiconductor device of claim 13, wherein the germanium concentration of the first top portion is 70% to 100%.

16. The semiconductor device of claim 13, wherein the germanium concentration of the second top portion is 30% to 50%.

17. The semiconductor device of claim 7, wherein the top surface of the STI is higher than the bottom surface of the first top portion.

* * * * *